United States Patent
Barabi et al.

(10) Patent No.: US 12,085,587 B2
(45) Date of Patent: Sep. 10, 2024

(54) HYBRID SHIELDING SOCKETS WITH IMPEDANCE TUNING FOR INTEGRATED CIRCUIT DEVICE TEST TOOLING

(71) Applicant: ESSAI, INC., Fremont, CA (US)

(72) Inventors: Nasser Barabi, Lafayette, CA (US); Chee Wah Ho, Chandler, AZ (US); Hin Lum Lee, Fremont, CA (US)

(73) Assignee: ESSAI, INC., Fremont, CA (US)

( * ) Notice: Subject to any disclaimer, the term of this patent is extended or adjusted under 35 U.S.C. 154(b) by 0 days.

(21) Appl. No.: 17/500,937

(22) Filed: Oct. 13, 2021

(65) Prior Publication Data
US 2022/0236302 A1      Jul. 28, 2022

Related U.S. Application Data (60) Provisional application No. 63/140,809, filed on Jan. 23, 2021.

(51) Int. Cl.
*G01R 1/067* (2006.01)
(52) U.S. Cl.
CPC .................. *G01R 1/06722* (2013.01)
(58) Field of Classification Search
CPC ................................. G01R 1/06722
See application file for complete search history.

(56) References Cited

U.S. PATENT DOCUMENTS

| | | | |
|---|---|---|---|
| 2010/0182097 A1* | 7/2010 | Hayashi | H04B 1/0458 333/32 |
| 2015/0369840 A1* | 12/2015 | Treibergs | H01L 23/49517 324/755.05 |
| 2020/0379010 A1 | 12/2020 | Tienzo et al. | |

FOREIGN PATENT DOCUMENTS

| | | | | |
|---|---|---|---|---|
| KR | 10-2044753 | | 11/2019 | |
| KR | 102103746 | | 4/2020 | |
| WO | WO2012/106221 | | 8/2012 | |
| WO | WO-2012106221 A1 * | | 8/2012 | G01R 1/0483 |
| WO | WO-2015195970 A1 * | | 12/2015 | G01R 1/045 |

OTHER PUBLICATIONS

Korean Intellectual Property Office, (KIPO), "Notice of Preliminary Rejection", in Korean Application No. 2022-0008607, dated Jan. 16, 2024, 17 pages.

* cited by examiner

*Primary Examiner* — Paresh Patel (57) ABSTRACT

High frequency operation of an integrated circuit test system is greatly extended by incorporation of a dedicated high frequency signal element that provides a circuit specific compensation network as part of the intermediation circuit board that enables connectivity between test equipment and the integrated circuit under test.

7 Claims, 8 Drawing Sheets

HYBRID SHIELDING SOCKETS WITH IMPEDANCE TUNING FOR INTEGRATED CIRCUIT DEVICE TEST TOOLING

CROSS-REFERENCE TO RELATED APPLICATION

This application claims the benefit and priority of U.S. Provisional Application No. 63/140,809, filed Jan. 23, 2021, which is incorporated herein in its entirety by this reference.

BACKGROUND

The present invention relates to systems and methods for reliable test tooling for packaged integrated circuits (IC) devices. In particular, improved signal transmission probe structures for IC device test tooling are provided.

Test socketing solutions for packaged IC devices have been subject to deviation and inconsistency in connection capability of the contact point and hence electrical continuity due to life cycle wear and tear stresses. These unavoidable effects have continued to instigate invalid test failures, higher retest rates, higher test-tooling down-time and resulting higher IC device test costs. Especially, with operating frequencies having increased dramatically from low hundreds of Megahertz (MHz) to several gigahertz GHz) in many consumer appliances, aspects of the test socketing solution have become even more critical. Although most signal connections are able to tolerate deterioration in the series resistance introduced as probe assemblies wear, grounding connections are far less tolerant of the introduction of series resistance, since ground currents can cause crosstalk between signal connections as well as signal distortion. This latter aspect of the effects of resistive elements is fairly broadband and more or less independent of frequency; skin effect, wherein the current flow is not in the bulk of the conductor but in a thin layer of the surface, contributes somewhat, but for small signals can usually be treated as a second order concern. However, reactive effects become quite pronounced with increasing frequency and if not compensated for will lead to errors and misleading results. Test-jigs are intended to be used for characterization and qualification so are expected to produce reliable and repeatable results for any of the device-under-test (DUT) parameters in a single process. This differs from the use of that same DUT in an actual application where the device external parameters such as voltages and currents are fixed at the prototyping stage and thereafter the only significant variable is the device itself. So, for example, a device test set may exercise the device at a number of frequencies of operation to select for levels of performance and this requires the test set to be capable of operating over a wide frequency range.

Contact probes of test tooling for testing IC devices are generally made from conductive metals and metallic alloys such as BeCu, brass and steel alloys. Depending on the specific applications, these contact probes can be coated and/or plated with a suitable conductive material such as gold, iridium, nickel, palladium and cobalt to provide a low resistance unaffected by oxidation, especially at the higher frequencies where skin effect dominates the current flow and then passivated with a suitable insulating layer to avoid short circuits in the jig itself.

However, during repetitive testing of the IC devices, e.g., after 100,000 test cycles, these contact probes of the test tooling will have been impacted continually by repeated connection to and disconnection from the IC devices under test. As a result, the contact probes are often subjected to contact deterioration as a result of plated conductive layer peel-off, metal oxidation and foreign material adhesion, leading to substantive contact capability degradation. Although signal connections can be tolerant of the introduction of resistance into the circuit when small currents are involved, regions of high current flow such as shared ground connections represent a serious problem. These physical changes, in addition to introducing resistive changes in the current paths also cause changes to the reactive elements of the circuit and this will result in a changed input signal which varies with frequency.

Furthermore, after repeated continual testing of IC devices described above, the penetration capability of the test tooling contact probes are also affected by the substantial loss of inherent compliant force generated by spring or elastic elements housed by the corresponding contact probe body or column. This problem is exacerbated by IC devices' reduced contact pitch sizes, e.g., from 1.27 mm to 0.2 mm or less.

It is apparent that an urgent need exists for improved high frequency performance of the contact probes of IC test tooling after repeated testing cycles. This improved probe performance enables more reliable testing of the ever-shrinking IC devices for extended periods without any unnecessary downtime of IC test tooling associated with failure or substantial degradation of contact probes.

SUMMARY

To achieve the foregoing and in accordance with the present invention, systems and methods for reliable testing of packaged high speed integrated circuit (IC) devices is provided.

In one embodiment, a test probe assembly is configured for testing packaged integrated circuit (IC) devices. The test probe assembly includes a plurality of probes or pins, a termination pad interposer that allows the test probes or pins to be connected at one side to the testing equipment as well as a docking component that assures repeatable alignment of the device under test. The plurality of probes is configured to repeatedly maintain reliable electrical contact with a corresponding plurality of contacts on the Device Under Test (DUT) when under a compliant force. An interposing pad provides mechanical and electrical coupling for the plurality of probes and further provides a point of termination for cabling from the various test equipment used to transmit and receive signals from the DUT. The interposing pad also incorporates reactive elements including sections of transmission lines to provide for proper matching or cancellation of some or all of those parasitic reactances introduced by the test jig.

Note that the various features of the present invention described above may be practiced alone or in combination. These and other features of the present invention will be described in more detail below in the detailed description of the invention and in conjunction with the following figures.

BRIEF DESCRIPTION OF THE DRAWINGS

In order that the present invention may be more clearly ascertained, some embodiments will now be described, by way of example, with reference to the accompanying drawings, in which.

DETAILED DESCRIPTION

The present invention will now be described in detail with reference to several embodiments thereof as illustrated in the accompanying drawings. In the following description, numerous specific details are set forth in order to provide a thorough understanding of embodiments of the present invention. It will be apparent, however, to one skilled in the art, that embodiments may be practiced without some or all of these specific details. In other instances, well known process steps and/or structures have not been described in detail in order to not unnecessarily obscure the present invention. The features and advantages of embodiments may be better understood with reference to the drawings and discussions that follow.

Aspects, features and advantages of exemplary embodiments of the present invention will become better understood with regard to the following description in connection with the accompanying drawing(s). It should be apparent to those skilled in the art that the described embodiments of the present invention provided herein are illustrative only and not limiting, having been presented by way of example only. All features disclosed in this description may be replaced by alternative features serving the same or similar purpose, unless expressly stated otherwise. Therefore, numerous other embodiments of the modifications thereof are contemplated as falling within the scope of the present invention as defined herein and equivalents thereto. Hence, use of absolute and/or sequential terms, such as, for example, "will," "will not," "shall," "shall not," "must," "must not," "first," "initially," "next," "subsequently," "before," "after," "lastly," and "finally," are not meant to limit the scope of the present invention as the embodiments disclosed herein are merely exemplary.

The present invention relates to systems and methods for improved contact probes of reliable test tooling for packaged Integrated Circuits (IC) devices. Probes of the types described in this document normally allow a complex suite of test equipment that often comprises power supplies, signal sources or generators, data gathering equipment and analysis equipment to be connected to integrated circuits having a large number of connections. The test equipment may be hard-wired to any test probe assemblies but modern implementations of testers routinely terminate the equipment on a termination plate or board, an interposing pad, which is then attached to the assembly that contains the probes. In this way one end of the pins that make up the probe assembly is coupled to the termination board leaving the other end ready for connecting to the devices under test. An important aspect to be borne in mind is that automated test equipment is intended to test a very large number of devices and so the need for repetitive connection and disconnection with high repeatability and reliability is a foundation design consideration.

Repeated connection and disconnection entails wear on the pin assemblies in the probing station with which they are associated and a consequence of this wear is to create variability in the quality of the connections to the DUT. Deterioration of the test jig whether mechanical or electrical is problematic since the resulting improper rejection of a part being tested has serious cost implications, especially with modern, high density technologies. Densities of connection are remarkable in that we routinely find interconnection pitches ranging from around 0.020" or about 0.8 millimeter or less, down to 0.5 millimeter. The actual pin layout and distribution of the pin density is of course dictated by the individual component part to be tested. By constructing the termination board for the test equipment separately from the probe assembly containing the contact pins it becomes feasible to change the probe assembly efficiently either when the pins begin to wear or on a planned maintenance schedule and thus avoid unplanned lost production in the testing equipment; noting that the connection between the probe assembly and the interposing pad is only changed when a new probe assembly is positioned as a replacement for the old worn part. As mentioned, the goal of this invention is to provide a mechanism for improving the performance of the test jig assembly that comprises the contact pins and their mounting jig.

Figure 1A:
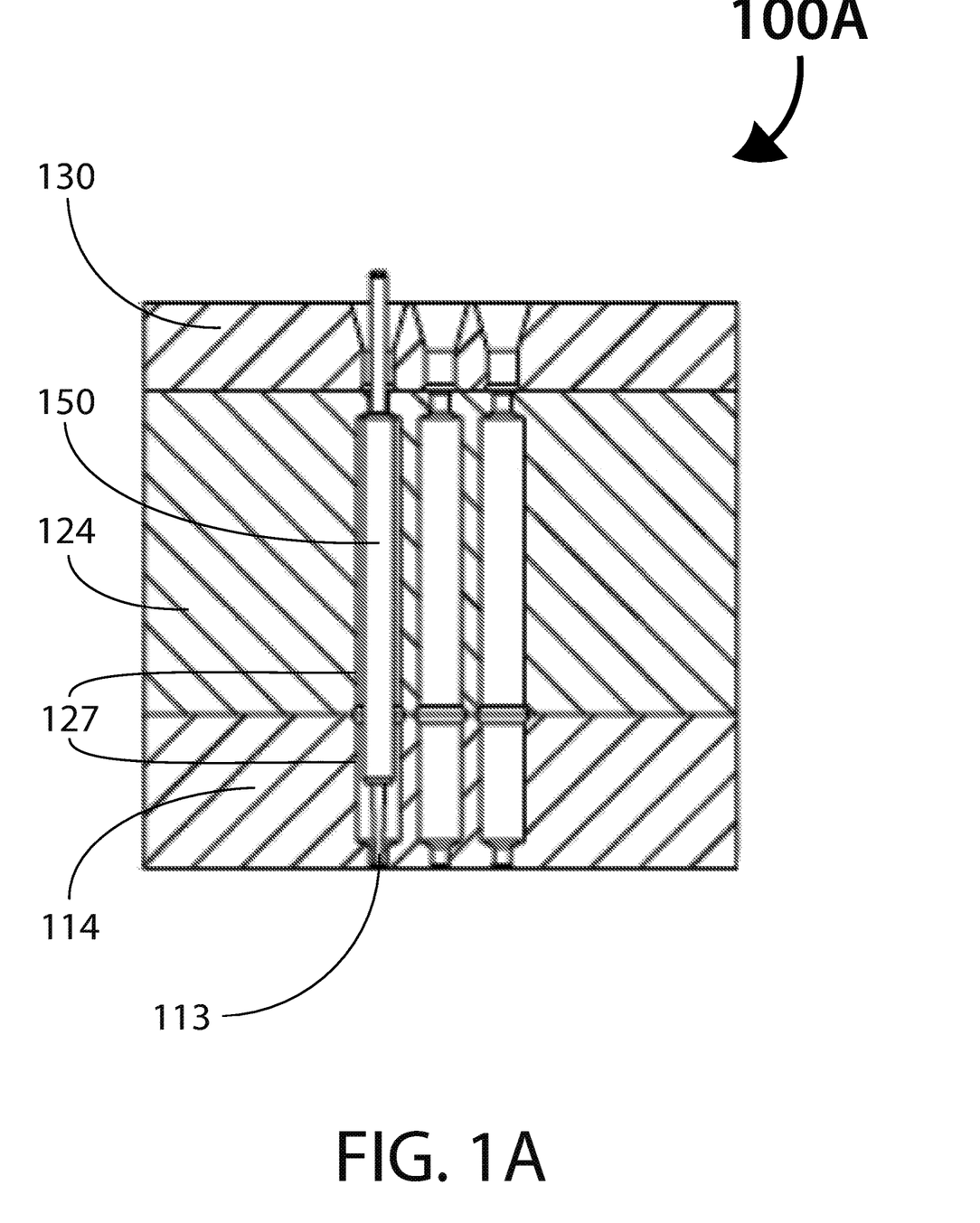
FIGS. 1A and 1B are cutaway views illustrating the elements of two alternative embodiments of high density test jig in accordance with the present invention.
Figure 1B:
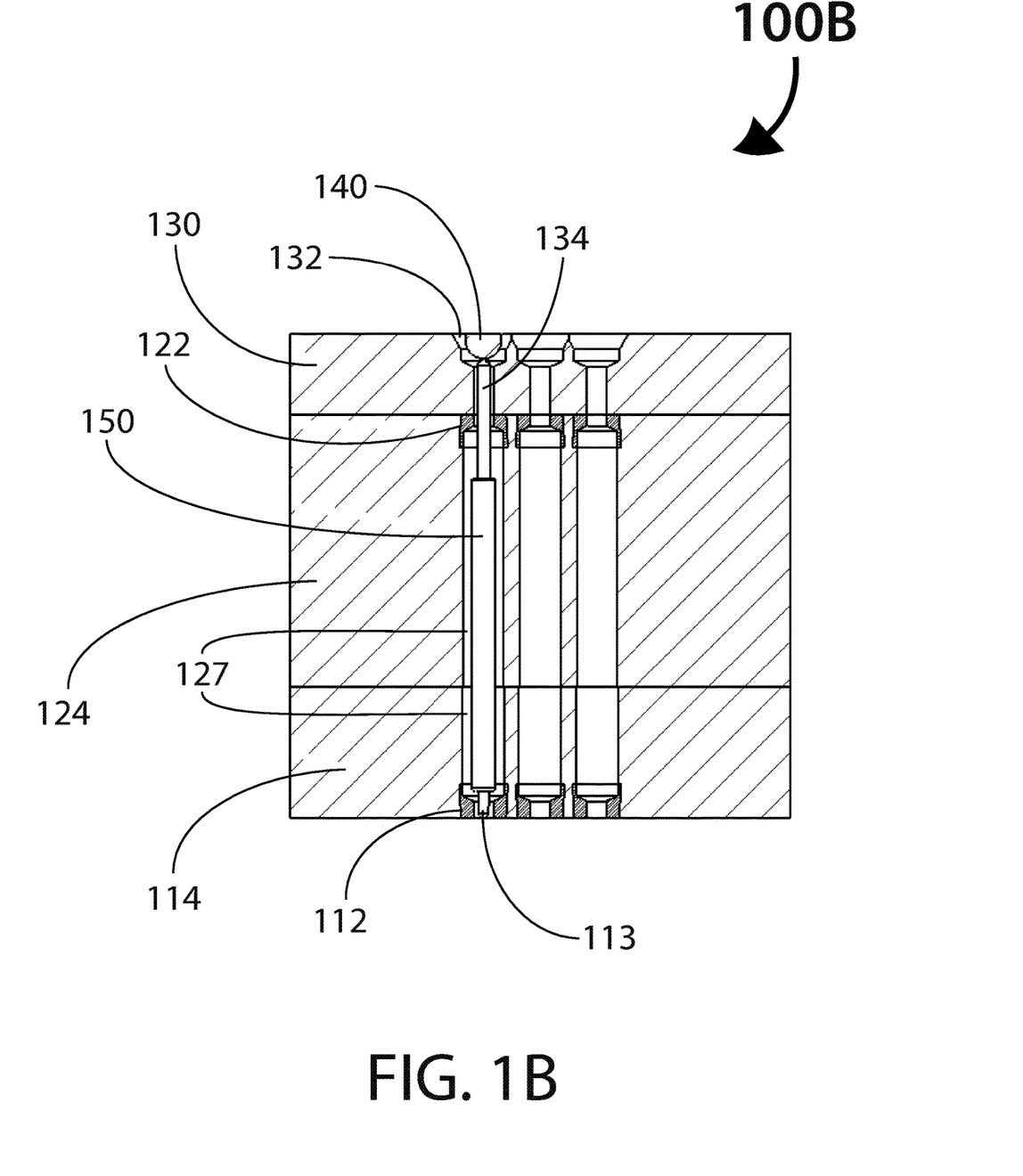

To facilitate discussion, FIGS. 1A and 1B are section views of alternative embodiments of test jigs showing the respective arrangement of the pins, in accordance with the present invention. For example, jig assembly 100A of FIG. 1A is shown with the connections 113 for the test equipment cables at the bottom of the drawing. A main block 124 is drilled so as to provide a clearance channel 127 for a test pin 150 and matching channels are drilled in the bottom block 114 which can be made from a suitable non-conductive material such as a plastic material. As shown in FIG. 1B, an optional bottom insulating spacer 112 ensures that the pin 150 is held centered in the channel and an optional corresponding spacer 122 is located in the upper part of the main block 124. It can be seen that the pins are typically positioned for the target connection points on the DUT and, when the DUT is moved into engagement with the test jig, the pins are placed in contact with the connection points and contact ensured with positive pressure often from a spring contained within the pin assembly itself. For a Ball-Grid Array (BGA) the upper block 130 has indentations 132 machined into the surface that receive the individual balls 140 of the BGA and allow the pin 134 to penetrate the ball's surface. The upper block 130 may be of a suitable non-conductive material such as a plastic material which allows the pins to be isolated from each other wherein the non-conductive material is selected for impedance tuning between the DUT and a PCB test circuit.

Figure 1C:
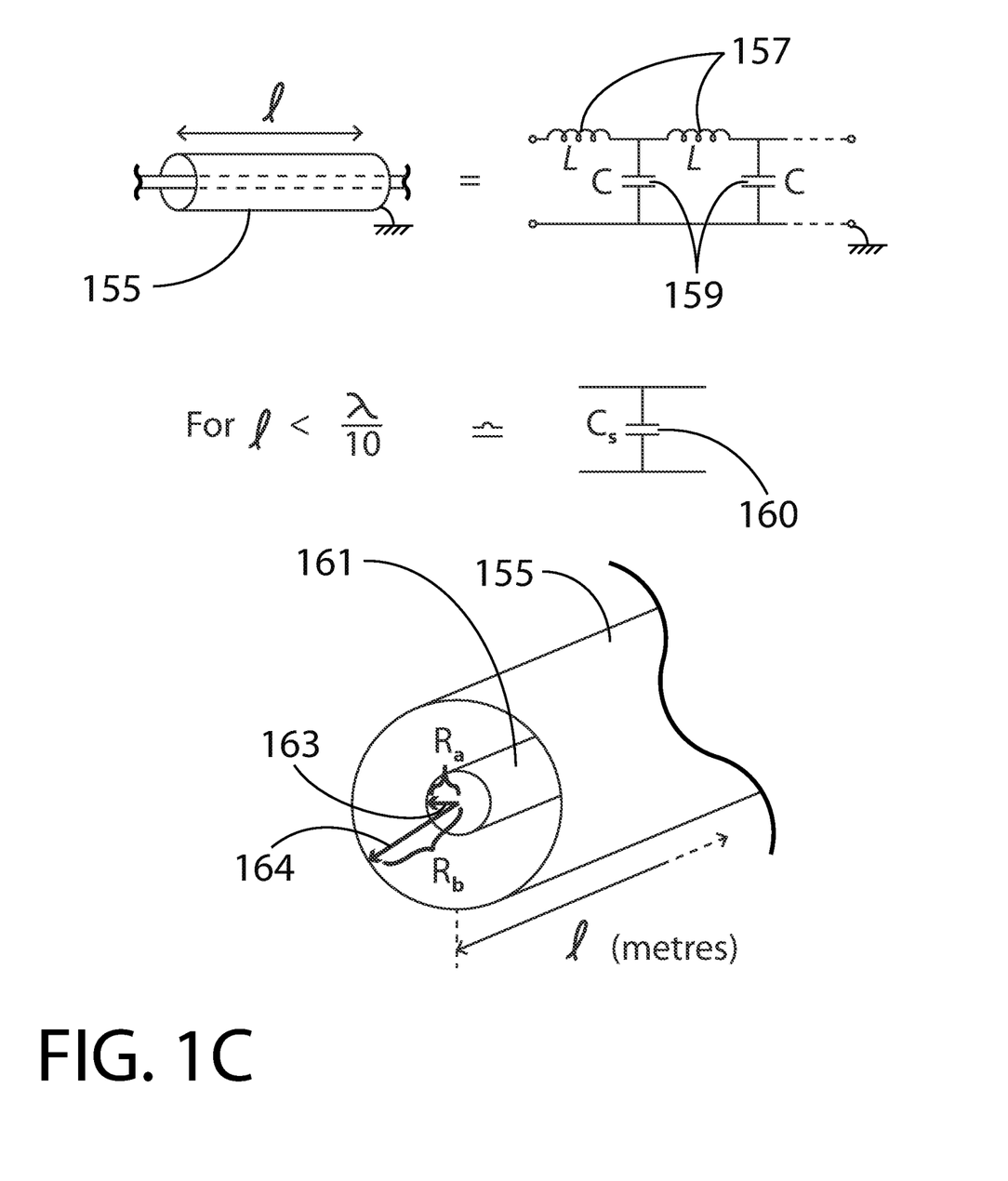
FIG. 1C shows the equivalent circuits for a coaxial section with simplifying approximations.

It will be observed that the pin 150 which is located within an enclosed metal cylinder formed by the drilling in the block 124 resembles a coaxial structure shown as 155 in FIG. 1C, having a length l ("$l$") which forms a transmission line at radio frequencies having an equivalent circuit comprised of a sequence of series inductors L 157 and shunt capacitors C 159 as shown in FIG. 1C. However, in practice, for very short lengths of this line, in terms of wavelength λ of the signal applied, this is fairly accurately represented as purely a shunt capacitance $C_s$ 160 between the signal conductor (the pin) and ground. The co-axial section is defined as having an inner conductor 161 set within an outer conductor 162 (sometimes referred to as the shield) with corresponding radiuses of $R_a$ 163 and $R_b$ 164. The simple example assumes that the space between the inner and outer conductor is quite symmetric and has a dielectric constant $\varepsilon_0$ the same as that of free space. In practice, the gap is often filled with some insulating material to accurately locate the inner conductor symmetrically, or nearly so, having a dielectric constant that is greater than that of free space and has a dielectric constant of $\varepsilon_r$ relative to that of free space. A transmission line propagates a signal, nominally without loss, and alters only its speed of propagation which can be represented as a phase shift; if a transmission line is exactly one half wavelength long at the frequency in use, then it introduces a phase shift of 180° or $\pi$ radians. As a broad generalization, a distance of under a tenth of a wavelength ($<\lambda/10$) is often used as a rule of thumb for deciding when a simplification to treat the line merely as a shunt capacitance and ignore the phase shift. The capacitance, being that of a simple cylinder for this approximation, is $2\pi\varepsilon_r\varepsilon_0 \times l/\ln(R_b/R_a)$ where l is the length of the coaxial section in meters, and ln means the natural logarithm. For the test jig of FIG. 1A, $R_b$ is now the inner radius of the channel 127 and $R_a$ is the radius of the pin 150. If we ignore the effect of the passivating layers on both pin 150 and the inside of the channel 127 within which it is inserted, for a channel diameter of 0.35 mm and a pin diameter of 0.3 mm we find that a 10 mm length of pin in the channel looks like a 3.6 pF (pico-Farad) capacitance between the connection at the device and ground. For the same channel with a pin of 0.15 mm diameter, this reduces to a shunt capacity of 0.66 pF.

In one implementation, the main body of the pin which is that larger diameter element that contains the spring that preloads the moving elements which slide into this main body, is slightly less than 3 millimeters in length and about 0.19 mm in diameter. It fits within a channel that is passivated to provide electrical insulation, the gap between the pin and the channel walls is about 40 μm and is primarily air, so the relative dielectric constant is only very slightly greater than 1 and for practical purposes we can ignore this small difference. As a coaxial section, the characteristic impedance is about 21Ω and the cutoff frequency (that frequency above which the section is able to propagate waveguide modes) is over 20 THz. Consequently, we can ignore the risk of multi-mode propagation and we note that this element is approximately one tenth of a wavelength long at 10 GHz and so for frequencies lower than this we can treat the section as a lumped shunt capacitance. Calculation reveals this to be about 48 pF/m or about 135 fF (femto-Farads) or $135 \times 10^{-15}$ Farads.

In some embodiments, the lower connecting pin 113 that is housed primarily within the lower block 114 can vary in length between about 0.15 mm and 0.25 mm, depending on the position or depression of the upper connecting pin 134 whose position is set by the size of the connecting land, or ball 140 in the case of a DUT that features a ball grid array. This is very much shorter ($<<\lambda/10$) than the guideline for considering it as a lumped element rather than as a co-axial section. As an air spaced example which in a second implementation is preferred over the incorporation of a dielectric washer, this represents a shunt capacity of 21 pF/m with a series inductance of 48 nH/m; this resolves to a shunt capacity of close to 1 fF, or $1 \times 10^{-15}$ Farads, and an inductance of about 2 pH (pico-Henries) indicating a resonant frequency greater than 1 THz for this element alone. In a similar vein, the upper connecting pin 134 when contacted by a connecting land, or ball 140 in a BGA, is about 0.85 mm long. The coaxial section formed here is slightly more than 11Ω, also much shorter than our guideline length so that it can be considered as a lumped element having a shunt capacity of about 80 fF with a series inductance of just under 10 pH yielding a self-resonant frequency of about 180 GHz. It can be seen then that for frequencies below 10 GHz this entire pin structure approximates a shunt capacity effect of about 125 fF and a series inductance of about 60 pH. This gives us a self-resonant frequency of about 60 GHz, well above the intended operating frequencies of the intended devices under test, that leads us to the conclusion that the effect of the pin assembly in the test jig is predominantly parallel capacitive in nature. The effect on the DUT is dependent upon the parasitic elements of that device. With increasing frequency, the device structures assume a more series inductive effect and so the pin structures in the test jig will, themselves, tend to provide some compensation for this.

In addition to the approximation in treating the coaxial structure of a connection pin located within a conductive channel as a simple lumped capacitance, it is also important to understand that once the section becomes more than one-tenth of a wavelength at the frequency of interest, it limits the simplification and is more appropriately treated as a transmission line problem. Without laboring the analysis, it is usually simple to solve the characteristic impedance, aided by using one of the on-line calculators which resolve the baseline performance from knowledge of the diameters of the outer channel, the inner conductor (pin) and the dielectric constant of the filling between the two conductors; the formulae for determining the parameters of transmission lines are published in any antenna text book that deals with such matters. For the two pin size examples above, these represent characteristic impedances of about 9Ω and 50Ω respectively, assuming that the dielectric is just air in the major part of the section. The effects of a solid dielectric at the ends of the pin structure can be ignored for simple examples but in marginal cases may have to be taken into account. Transmission in a coaxial structure below cutoff is transverse electro-magnetic (TEM) where the electric field is radial between the inner and the outer and the magnetic field surrounds the inner conductor entirely within the space between the inner and outer conductor; the lines of magnetic field are circular. With the dimensions of the test jig components, such as the pin and channel, in the low single figure millimeter range, waveguide modes can be ignored below several hundred GHz, but it should be understood that once the cutoff frequency is approached then consideration must be given to the effects of propagation of different modes with dramatically different propagation velocities.

Figure 1D:
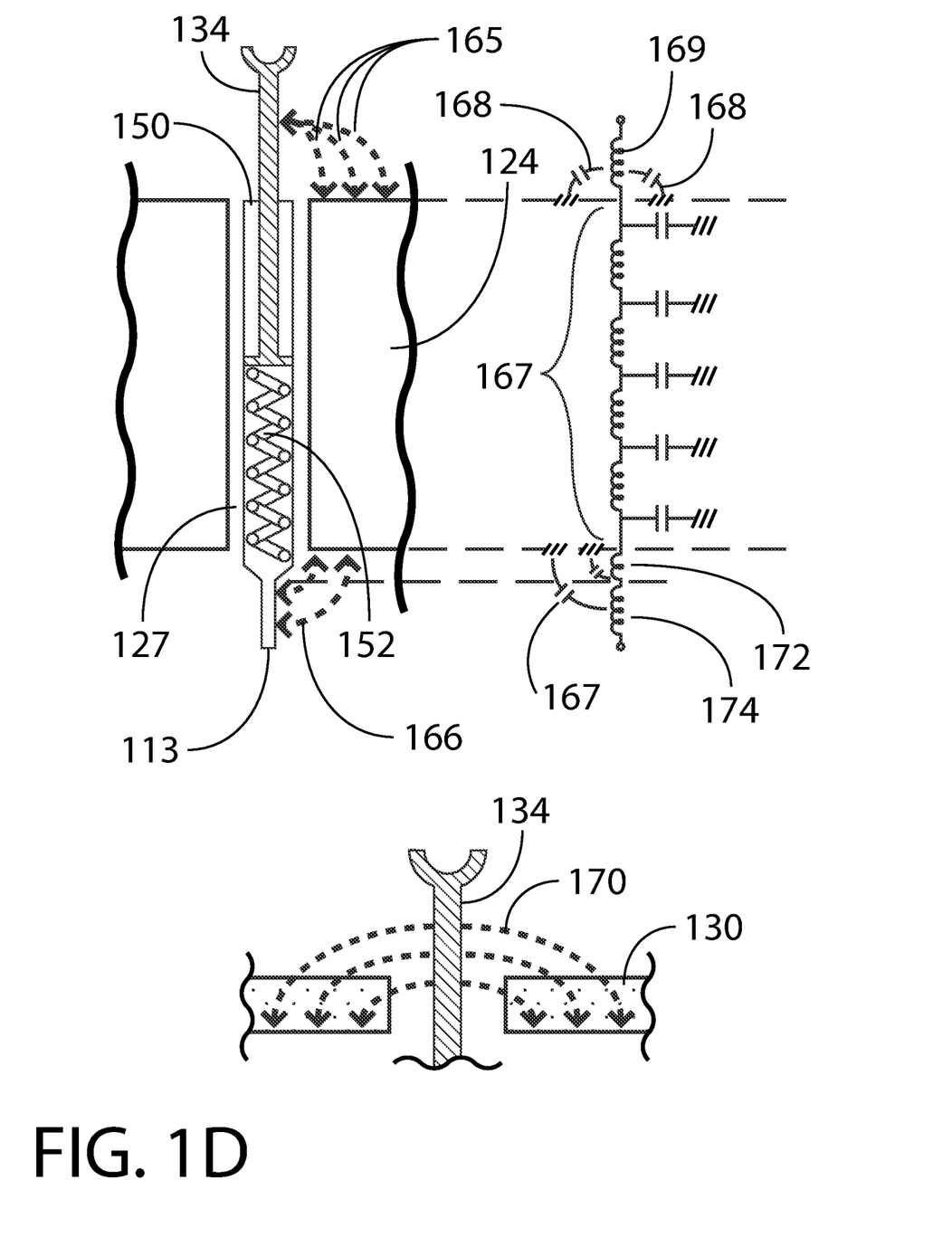
FIG. 1D illustrates the effects of altering the materials used for upper and lower layers of the main test jig block.

Looking now more closely at a single representative pin in the test jig assembly at FIG. 1D the channel 127 is seen cut into the main block 124 and the pin itself 150 is shown positioned but without the obscuring detail of optional insulating washers 112 and 122 of FIG. 1B. The upper displaceable contact pin 134 and its tension spring 152 is movable along the long axis of the pin assembly 150 so that when pressure is applied by the land or ball 140 of the device under test (see FIG. 1B) the pin is sufficiently compliant to allow a close fitting to the test jig whilst the spring force ensures good electrical and mechanical contact with the DUT. Normally an upper layer 130 (not shown in FIG. 1D for clarity) is provided so as to secure the optional positioning washers 122 and may be of the same material as the main block 124. If this upper layer 130 is a metal, then the effect is to cause the depressible pin section to exhibit the characteristics of a co-axial section but of a significantly different and larger characteristic impedance to the main pin assembly 150. This abrupt transition is not a desirable aspect because of the strong frequency dependence which leads to compromised testing at the higher frequencies. A simple representation of the equivalent circuit model for the jig in this one pin example is shown to the right of the physical view. The pin structure in the main block is represented as a classical transmission line equivalent 167, comprised of alternating inductance and capacitance elements. The depressible pin appears electrically as an inductance 169 with capacitance 168 to the main block 124. The electric field is shown as lines 165, 166 (on one side just for clarity in the figure) which is what provides the capacitance effect. The magnetic field is unaffected for the most part and is concentric around this pin element. The distribution of the electric field means that the inductance 169 of this part of the pin is partially cancelled by this capacitance 168 but this occurs mostly at the lower part of the pin element close to the top surface of the main block. By using an insulating material for the upper layer 130 with a dielectric constant which is significantly higher than that of air, the electric field is concentrated 170 and the capacitance is increased and a benefit is that this increases the capacity further along the pin element. This results in a more gradual transition of impedance from the location where the depressible pin enters the body of the pin assembly, further along the pin. This more gradual change in impedance remedies the problems that result from an abrupt transition so that test performance is improved. A similar system is used at the lower part of the main block (not shown here) which compensates for the usually smaller inductances 172 and 174 and capacitance 167 at the structure of the pin assembly where it would normally connect to one or more intermediating circuit boards for connection to the test equipment. Using an insulating material for the upper layer such as a polyimide (e.g. Kapton™) offers a good solution which is durable and has an acceptable loss tangent at 20 GHz. Teflon™ is also acceptable but although it has a better loss tangent is somewhat more prone to damage. Depending on the characteristics of the DUT as regards the working impedance at the testing frequency, altering the plastic material at this upper layer allows small changes in the capacitance effect which can improve circuit matching.

Input circuits and output circuits for typical semiconductor devices are often either analog signal levels or digital signal levels. Analog types of devices that operate at the higher radio frequencies are generally characterized in depth and the input and output impedances are exhaustively analyzed so that a designer will be able to incorporate the component into a product in a fairly straightforward way. By contrast, digital devices are rarely characterized in this way and so it is not uncommon for a circuit implementation to require unanticipated modifications at the higher frequencies. When a high frequency signal is propagated along a printed circuit board track, the track itself quickly assumes the properties of a transmission line. In simple systems, this is overcome by keeping the distances involved to a minimum but as frequencies increase, it becomes quite difficult to minimize the effects. A transmission line brings with it the effects of phase shift as well as dispersion (the property of frequency related changes in the velocity of propagation) and the net result is that, where single frequencies are only delayed signals comprised of multiple frequencies are distorted. Signals in digital circuits are usually of square or rectangular wave-form and their decomposition into their frequency components shows that in addition to the fundamental frequency, harmonics of this fundamental are often present in significant amount. Thus, for example, a square wave is seen to have odd harmonics of the fundamental present in the signal. It should be clear that if these harmonics are shifted either in time or in amplitude then the result will be significant signal distortion; indeed even at comparatively low frequencies this effect can be directly observed. Modern digital systems are built to be synchronous so that the actual status of an input is determined at a specific time by a common clock signal so that provided the inputs have enough time to settle, then the distortion problem (where the supposed square wave is not at all square) is mitigated because at the time of reading the amplitude of the input signal will have stabilized above or below the digital threshold voltage.

In a high frequency probe system such as found in testing modern high speed integrated circuits, the simple solutions are generally unclear. Because of the comparatively short wavelengths at the test frequencies, good quality grounds are essential to prevent interference resulting from the physical distances between current paths being substantial fractions of a wavelength of the applied signals. This then requires ground connections that are close to the signal connection and not dependent on other notionally grounded points in the test jig; note here that even though a direct current test may show the various ground points to be at the same potential, this rarely holds true at the frequencies of operation. Indeed at radio frequencies it is simple to provide a structure which appears to be open circuit at the operating frequency whilst being at ground potential for the purposes of the power supply current.

Once a semiconductor device has been roughly characterized, the construction of a test-jig to allow performance or qualification testing to take place can be undertaken by factoring in the effects of the test-jig elements. The existence of connecting components such as test pins introduces parasitic reactances or impedance transformation effects. For example, the addition of a parallel capacitance or series inductance which would not normally be present when the device is used in a circuit, because of the test jig itself must be compensated for at some point. The effects of the reactance or phase change effects due to the test jig must be mitigated by the test jig or else the test jig must be considered insufficient for use above a certain frequency. The goal of the invention described here is to extend the usable range of the test jig by building in the compensatory elements directly into the jig assembly as closely as practical to the DUT. Existing technologies in test-jig construction are able to operate adequately up to several GHz without too much difficulty and individual problems dealt with directly, but with the increasingly fine pitches of connection points and increasing frequencies of operation a more competent scheme must be found.

Normally, connectivity between the contact pins 113 of the test-jig and the associated test equipment is made using cabling from the test equipment that connects to an intermediating circuit board. Earlier equipment often used direct connection to the test pins themselves, but the density of the pins is now so high that direct connection is impractical because of the difficulty of repairing failures at the connection points. With high cycle counts, any flexing of the cabling risks creating stresses at the point of connection to the pins with commensurate failure. By using an intermediating circuit board equipped with appropriate termination connections, much of this stress is completely mitigated at the pin connection. The problem of shielding low level signal paths is also eased because grounded paths may be placed either side of the signal track on the circuit board to reduce susceptibility to interference. If a ground layer is also present on the circuit board, usually on the side opposite the side that carries signals, then the shielding performance is dramatically improved. On benefit that accrues with this solution is that since the characteristics of the base material for the circuit board are often well controlled, it is possible to define the impedance of the tracks making the signal connections so that now it is possible to create transmission line transformers that can convert the impedance at the input connection to the device into a suitable impedance that will properly terminate the signal source.

Figure 2:
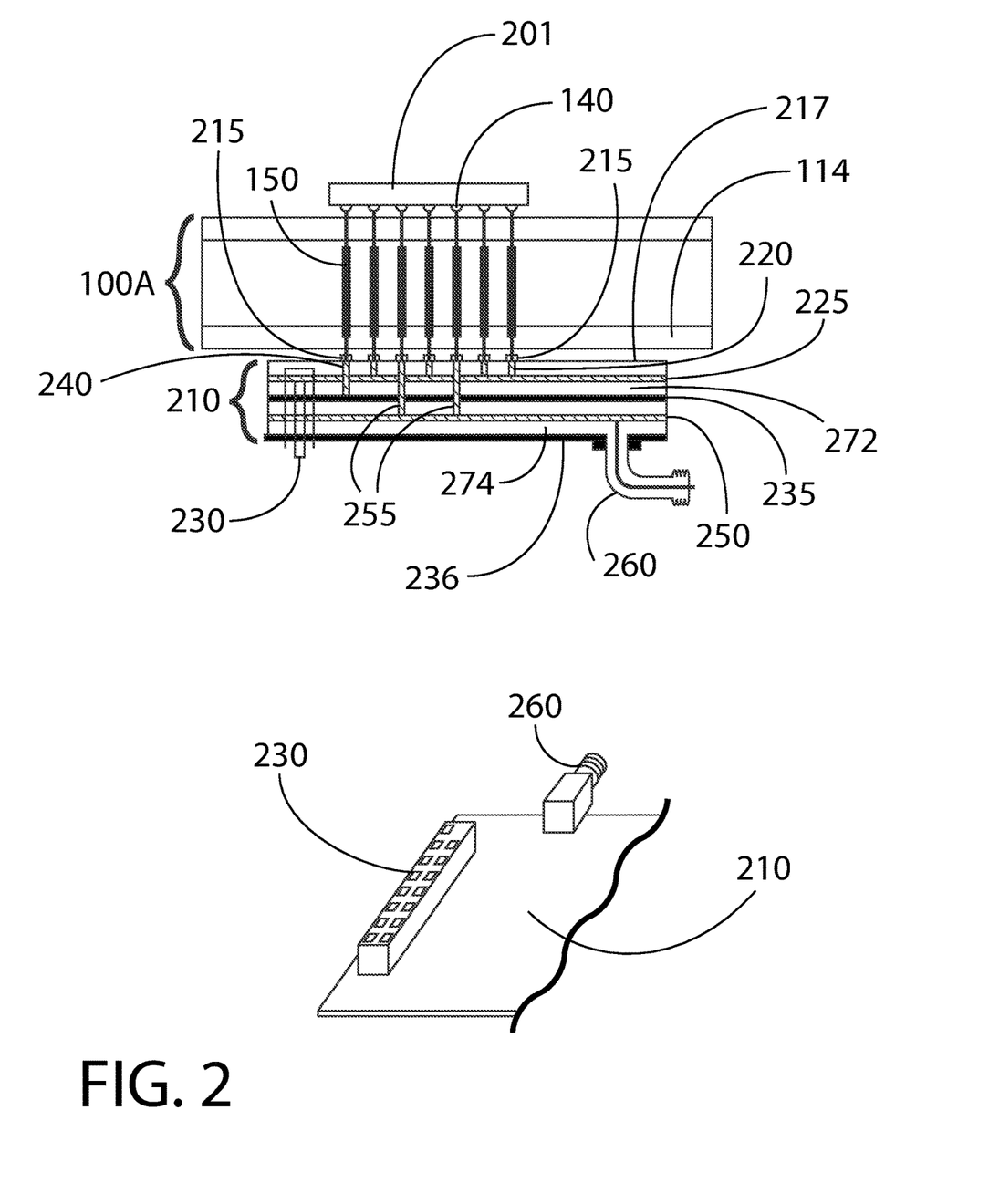
FIG. 2 shows how the test jig assembly is coupled to the device under test and the test equipment.

In one implementation of the invention, signal paths are created using a microstrip structure. FIG. 2 illustrates this; the base test jig assembly 100A that secures the contact pins 150 is shown with the Device Under Test 201 positioned so that the contact balls 140 of its contact array mate as shown in FIG. 1B. Located at the opposing end of the contact pins 150 is an intermediating circuit board assembly 210 with contact lands or points 215 located so as to connect to the pins. These lands 215 may be plane or raised and of any required shape or geometry to assure reliable electrical contact and preferably of a non-oxidizing or chemically inert nature. Ideally the lands would complement the pin materials so as to exclude thermoelectric effects. As shown, the figure illustrates a five-layer circuit board as a one piece construction, purely for the purpose of example and discussion. The upper (in this figure) or first layer 217 has the contact lands that make electrical contact with the pins of the jig but it may be advantageous to provide an extensive ground plane coplanar with these lands, arranged so as to provide the lowest loss ground connections for the ground vias 240 on the test jig. This may be a segmented ground so that, for example, ground currents in one part of the DUT are separated from ground currents in another part of the DUT.

The second layer 225 as shown is the distribution layer for all the low speed connections to the DUT. The lands 215 are coupled to the distribution layer using through-hole vias 220 and the distribution layer is terminated at a connector block 230 using vias that bring the connections to the lower surface. This connector 230 is shown for the sake of discussion and can equally be provide by a flexible printed circuit extension that is part of the second conductor layer 225 so that the connection can be rendered in some other convenient form. The third layer 235 and fifth layers 236 as shown are ground planes and in this figure, ground current is provided through via 240 to the contact land 215 above it. The fourth layer 250 is the high speed signal layer which is connected to the contact lands using vias 255a, 255b. This figure shows a fifth layer as a ground plane 236 and is representative of one implementation. Since this is intended as a signal ground plane only, it may be omitted in certain cases or may feature coupled structures that allow for frequency dependent adjustments to the operation of the embedded high speed signal transmission lines constructed at fourth layer 250. For example resonant structures that can be used to create filter characteristics to augment or diminish certain frequencies as part of a test regime. Finally, terminations for the high speed signals are shown as a co-axial connector 260 of which there can be as many as required for the application being tested; the partial isometric sketch is illustrative.

Figure 3:
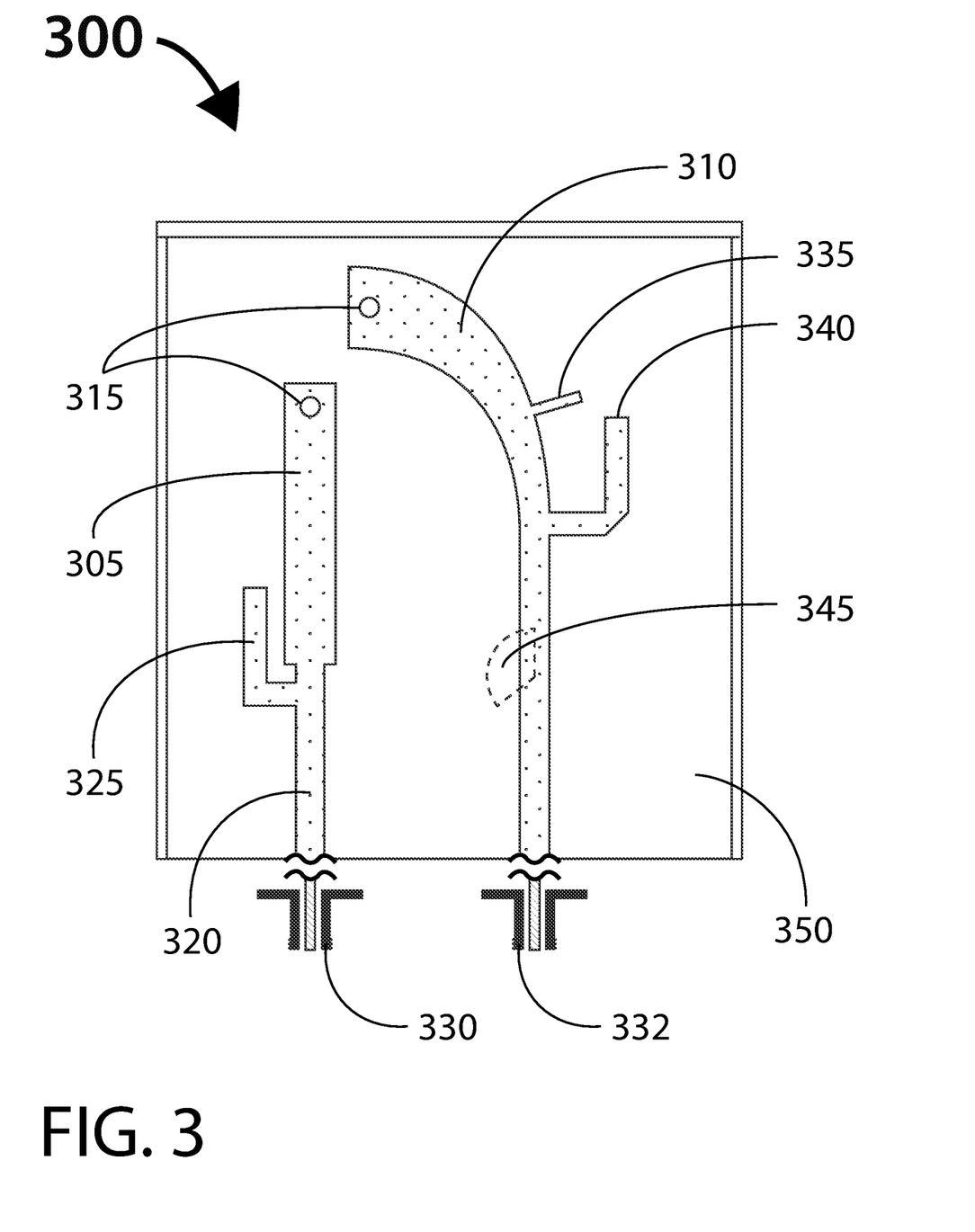
FIG. 3 shows a simple example of high frequency matching networks between the test jig and high frequency cabling.

Although FIG. 2 shows a single multi-layer board in the illustration, practical circuits may require a different approach. Of concern is the dielectric constant of the substrate for the high frequency signals. Ordinary circuit board materials such as FR4 fiberglass and epoxy construction are useful up to the low GHz range of frequencies, but their dielectric constant, approximately 4.4, varies across the board due to its inherent inhomogeneity and the loss tangent is approximately 2%. This is of lesser concern when the circuit tracks are not as frequency sensitive, but when tuned elements are used, dispersion and loss effects are troublesome. Further, tuned systems tend to be dimensionally large with the low dielectric constant materials. Therefore a hybrid approach that uses the lower cost FR4 types of material for supporting the power and lower frequency connections to layers 217, 225 and 235 along with higher dielectric constant materials such as alumina, dielectric constant 9.8 with a loss tangent of 0.01%, yields better performance and smaller sizes for the tuned elements at high speed signal layer 250. Greater advantage can be gleaned by using polycrystalline or even mono-crystalline forms instead of the amorphous alumina; sapphire and emerald for example. FIG. 3 shows an exemplar signal layer that includes simple impedance matching circuits in a typical microstrip style. Here we are seeking to transform the impedance at the input pin of the device under test to match the working impedance of the test equipment such as signal generators or network analysis tools.

FIG. 3 is a top view 300 showing circuit substrate 350 together with structures of the high speed signal layer 250 of FIG. 2, the high speed structures including two exemplary impedance matching networks, both 305 and 310 are designed to be used to match a lower impedance to a higher impedance. The reverse of the circuit substrate 350 is plated with a conductive ground layer 236, not shown since its use is commonplace in radio frequency engineering arts. Connecting vias 315 are formed or drilled in the substrate material to correspond to vias formed in the low frequency circuit board to carry the signal from the contact pins to the high frequency signal layer 250 located on top of substrate 350. Considering circuit 305 the impedance of the microstrip or stripline element starts as a section of lower impedance (wider) line and, at an appropriate point, the is stepped down to a narrower line 320 having the required impedance to match the test equipment load requirements at the coaxial connector 330. The outer of this connector is connected to the ground plane 236 at the reverse side of the substrate. It should be realized that the ground plane may be formed so that the edge of the substrate is also grounded and possibly continued part-way on the upper circuit surface shown. Purely by way of example, a stub line 325 can be used to create a frequency dependent reactance component that may be used to compensate for anomalous behavior such as a resonance when in use; the location of such supplemental lines is determined as part of the engineering task of frequency dependent matching.

Stepped matching transformers, those having discrete impedance steps at defined intervals have the property of being somewhat narrowband in their frequency characteristics so one design choice is to simply make progressive steps to reach the required impedance which enlarges the bandwidth of operation. The natural extension of this is to produce a tapering conductor 310 which starts at the load impedance value of the part being tested and smoothly transitions to the target impedance value for the test equipment cables, usually at the coaxial connector 332. Stubs 335 and 340 are shown as examples of more frequency dependent compensation reactances and 345 illustrates an exemplar resonator which is created by removing conductor material from the ground plane 236 beneath the line. The structure is typically shaped as the segment of a circle and the degree of coupling set by the overlap of the segment with the line above it. Other resonator shapes are possible and known in the radio frequency design arts. This category of structure can be used to remove or enhance specific frequencies depending on its location along the line. In one implementation, a second substrate having a ground plane only is located immediately over the microstripline structure so that the electric fields are entirely contained within a dielectric and this has the added benefit of serving as additional shielding from interference.

Figure 4:
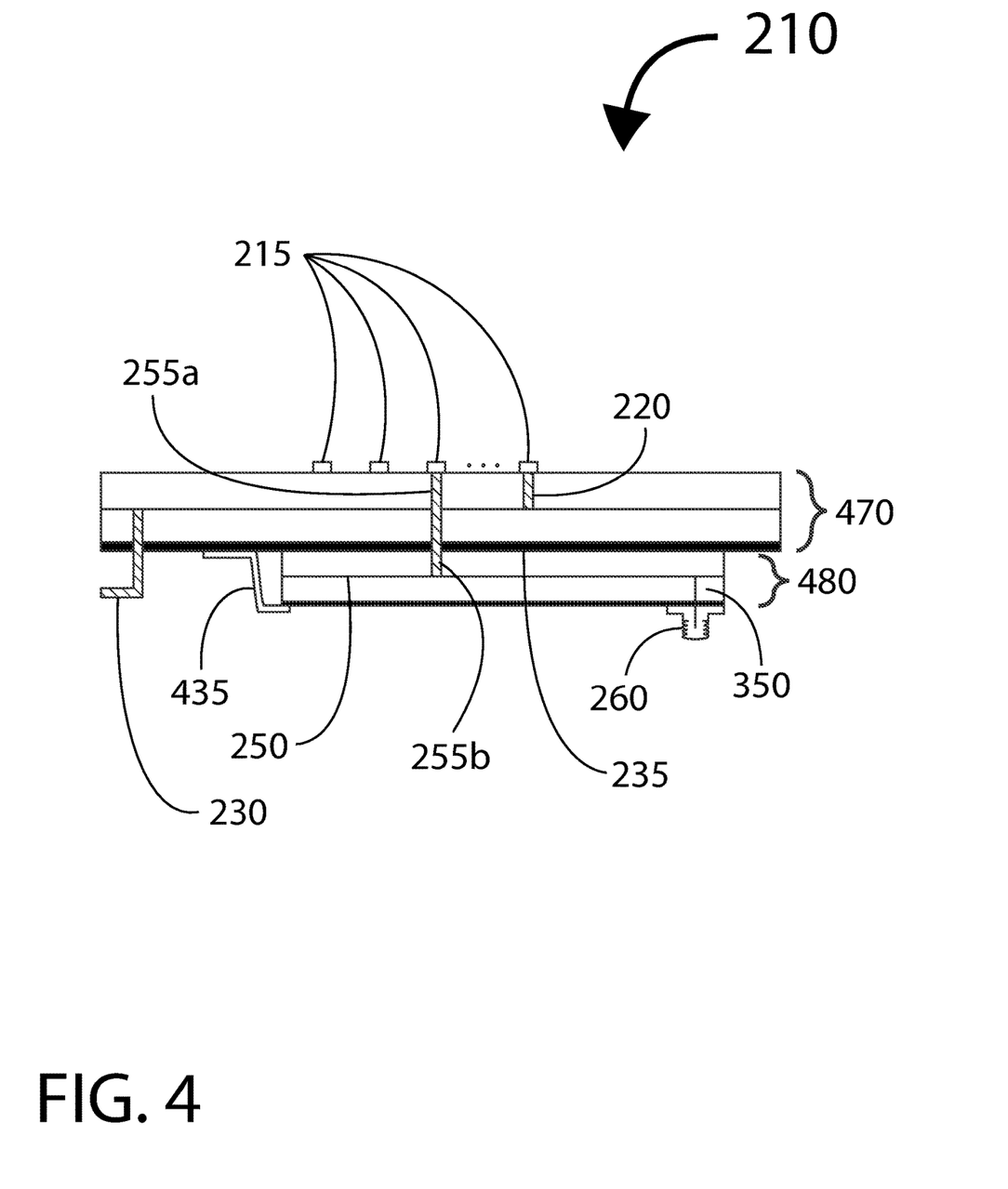
FIG. 4 illustrates a means of connecting two different types of substrates for the intermediating circuits that connect the test jig to external test equipment.

FIG. 4 is a cross-sectional view illustrating one implementation of a hybrid construction for the intermediating interposing pad 210 that connects the test equipment cabling to the test jig. The power and low frequency circuits can be implemented on a standard circuit board 470 where connection lands 215 facilitate connection to the test jig assembly having connecting pins. Conductive via 220 allows certain pins to be connected to the low frequency and power layer which then couples them to a system for connecting to the test equipment; in this figure this is shown as a connector grouping 230 to which cables can be attached. As mentioned above, this connection can also be a flexible printed circuit extension that is an extension to circuit board layer 225. The high frequency circuits are coupled from lands 215 using vias 255a on the low frequency circuit board 470 and corresponding vias 255b on the high frequency circuit board 480, and then to the structures of high speed signal layer 250 which in turn couples the signals via impedance transformation networks to coaxial transmission lines either using connectors 260 or having lines directly attached to the substrate. In one implementation, the interconnection between vias is provided by soldered connections. In a second implementation pogo-pins are used to provide the connection. In some embodiments, third layer 235 can be an anisotropic conductive film (ACF) used to interconnect the low frequency circuit board 470 to the high frequency circuit board 480, ensuring conductivity for the signal and ground connections. In some implementations, simple clamping brackets 435 are used to provide mechanical stability to the assembly of FIG. 4.

Figure 5:
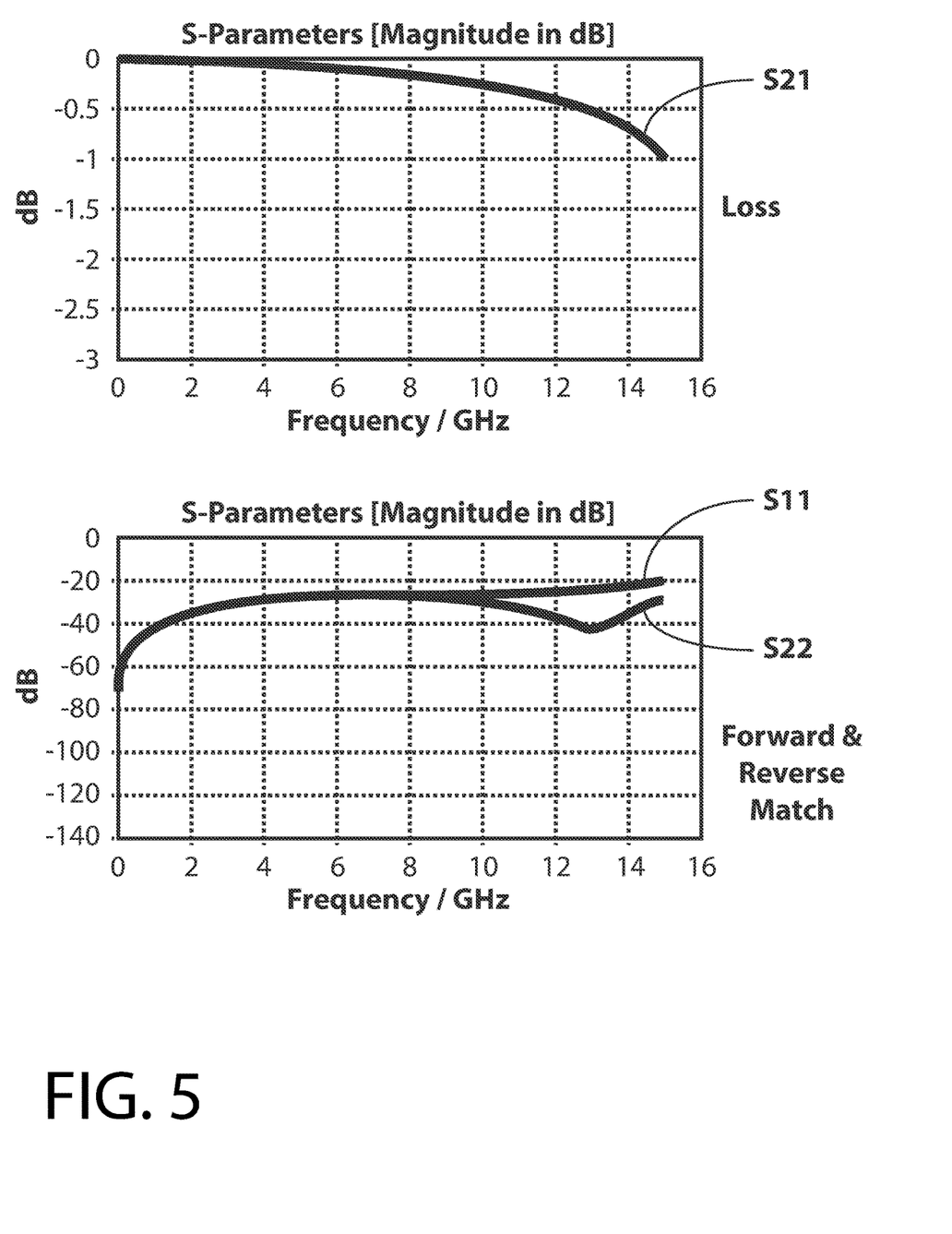
FIG. 5 shows a graphical representation of transmission loss and the return losses for sample pins.

Turning finally to FIG. 5, example measurements of the effects of upper block 130 being an insulating upper layer instead of a conductive layer are shown. The loss performance $S_{21}$ where this represents the power out of port two compared to the power in at port one, shows primarily the effect of the loss tangent of the insulating material increasing with frequency. The quality of the match is expressed as a return loss and it can be seen that in this example the match degrades slightly as frequency increases for $S_{11}$, the reference plane being at upper layer 217 of the intermediating interposing pad 210 close to the bottom layer 114 of the test jig. A 20 dB return loss indicates that the reflection coefficient at this point is 0.1, or 10% power is reflected; this can be stated as a standing wave ratio of 1.22:1. However upper block 130 being a plastic layer in place of a conductive layer for the connection point of the DUT results in an improved performance above 8 GHz for $S_{22}$, with a return loss of better than 40 dB, a reflection coefficient of about 1% or 0.01 which approaches the measurement accuracy of the test set-up. This indicates that considerable benefit can be expected from careful selection and positioning of materials used to construct the test-jig. Testing to 15 GHz is shown to be reliable and repeatable and the addition of enhanced matching networks will allow this range to be extended significantly.

While this invention has been described in terms of several embodiments, there are alterations, modifications, permutations, and substitute equivalents, which fall within the scope of this invention. For example, many modifications are possible and the above described features from the various embodiments can be useful alone or in combination. Although sub-section titles have been provided to aid in the description of the invention, these titles are merely illustrative and are not intended to limit the scope of the present invention.

It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention.

What is claimed is:

1. An interposing pad for a test probe assembly having a plurality of probes useful for testing a packaged integrated circuit (IC) device under test (DUT), the interposing pad comprising:
   a power layer and a ground layer insulated from each other;
   at least one signal layer insulated from the power layer and the ground layer, the at least one signal layer having one or more signal transmission lines;
   one or more vias providing electrical coupling between the plurality of probes and the one or more signal transmission lines, and wherein the one or more vias are configured for transmitting and receiving signals from the DUT to at least one point of termination for cabling from a test equipment; and
   one or more reactive elements coupled to one or more sections of the one or more signal transmission lines that provide matching or cancellation of parasitic reactances introduced by the test probe assembly wherein the one or more reactive elements is a resonator at a predetermined resonant frequency.

2. The interposing pad of claim 1 wherein the resonator includes a signal transmission line, a resonant structure or a stub.

3. The interposing pad of claim 1 wherein the interposing pad includes two or more substrate materials having different relative permittivities.

4. The interposing pad of claim 3 wherein the two or more substrate materials are coupled using an anisotropic conductive film to provide electrical connectivity between the DUT and the at least one point of termination.

5. The interposing pad of claim 1 wherein the resonator is a coupled resonator and is formed in a ground plane.

6. The interposing pad of claim 5 wherein the resonator comprises a circular segment etched into the ground plane so as to present an open or short circuit effect at one of the one or more signal transmission lines for suppression or passage of the predetermined resonant frequency.

7. The interposing pad of claim 1 wherein an effect at the predetermined resonant frequency is enhanced depending upon location of the resonator along the one or more signal transmission lines.

* * * * *